United States Patent [19]

Moyal

[11] Patent Number: 5,296,858

[45] Date of Patent: Mar. 22, 1994

[54] IMPROVED TWO-STAGE ANALOG-TO-DIGITAL CONVERTER

[75] Inventor: Miki Z. Moyal, Austin, Tex.

[73] Assignee: Advanced Micro Devices, Inc., Austin, Tex.

[21] Appl. No.: 882,666

[22] Filed: May 14, 1992

[51] Int. Cl.$^5$ .............................................. H03M 1/14
[52] U.S. Cl. ...................................... 341/156; 341/136
[58] Field of Search ............... 341/156, 136, 122, 158, 341/155

[56] References Cited

U.S. PATENT DOCUMENTS

| | | | |
|---|---|---|---|
| 4,533,903 | 9/1985 | Yamada et al. | 341/156 |
| 4,599,599 | 7/1986 | Sekino et al. | 341/156 |
| 4,745,393 | 5/1988 | Tsukada et al. | 341/156 |
| 4,903,028 | 2/1990 | Fukushima | 341/156 |
| 4,912,470 | 3/1990 | Hosotani et al. | 341/156 |
| 5,099,240 | 3/1992 | Nakatani et al. | 341/156 |
| 5,187,483 | 2/1993 | Yonemaru | 341/156 |

Primary Examiner—Howard L. Williams
Attorney, Agent, or Firm—Foley & Lardner

[57] ABSTRACT

An apparatus for generating a digital signal representing an analog signal comprising a reference array establishing reference values at hierarchically arranged reference nodes in response to a reference signal. The apparatus includes a first iteration comparing circuit comparing selected first reference values present at first nodes with the analog signal. The first reference values establish a plurality of ranges of reference values. The first comparing circuit generates a first output signal indicating a particular range in which the analog signal first compares with respect to a reference value in a predetermined relation. A logic circuit generates a control signal in response to the first output signal. A second comparing circuit effects second comparing of selected second reference values with the analog signal. The second reference values are present at selected nodes which are in intervals adjacent the first reference nodes and hierarchically segment those intervals. The second comparing circuit responds to the control signal to effect the second comparing and comprises a plurality of second comparators. Each second comparator receives the analog signal as a first input and receives hierarchically equal of the second reference values from the intervals as a plurality of available second inputs. One of the available second inputs is selected as the second input value to each second comparator in response to the control signal. The second comparing circuit generates a second output signal and the logic means responds to the first output and the second output to generate the digital signal output.

14 Claims, 2 Drawing Sheets

IMPROVED TWO-STAGE ANALOG-TO-DIGITAL CONVERTER

BACKGROUND OF THE INVENTION

The present invention addresses the conversion of analog signals to representative digital signals; specifically, the signals present invention deals with two-stage flash conversion of analog signals to representative digital signals.

Flash analog-to-digital signal converters generally apply a reference voltage to a resistor array and connect a first input of each comparator of an array of comparators to nodes intermediate each of the resistors in the array. Usually the resistors in the resistor array are all equal in value. An input analog signal is applied to the second input of each of the respective comparators. The voltage drops across the resistor array present a voltage input at the first input of each of the respective comparators. The various voltage inputs differ from each other by a predetermined differential amount which is established by the individual resistances in the resistive array. Comparison of the input analog signal to each of the various reference voltages presented will result in a first output presented by those comparators at which the input analog signal exceeds the respective reference voltage presented at a respective comparator, and will result in a second output by those comparators at which the input analog signal does not exceed the respective reference voltage presented at the respective comparator. The outputs of the comparators are applied to a logic circuit which is configured, or programmed, to present the various comparator outputs as a digital signal output which is representative of the various comparator outputs and which, in turn, represents the input analog signal applied to the various second inputs of the respective comparators. For such a flash converter circuit to present a digital representation of the input analog signal in n-bits, the converter must employ $2^n$ resistors and $2^n$ comparators.

In implementing such circuitry in CMOS technology, comparators occupy a relatively large amount of "real estate", or space, on a substrate. In an effort to miniaturize such analog-to-analog conversion circuits, prior art designers have developed two-stage flash converters, commonly known as half-flash analog-to-digital signal converters. Such a half-flash analog-to-digital converter will employ $2^n$ resistors in establishing a reference resistor tree similar to the resistor tree required for a flash converter. However, the comparators are arranged differently, since a comparator occupies more real estate than is required for a resistor. For example, an n-bit analog-to-analog half flash conversion circuit may have a first stage comparator circuit with respective comparators having a first input connected every nth resistor node so that comparison of the input, or received, analog signal applied to the second input of each respective first stage comparator with the reference voltage present at the first input of each respective comparator yields a first iteration indication at the outputs of the first stage comparators which is representative of a predetermined number of the most significant digits of the digital representation of the received analog signal.

This first iteration indication is applied to a logic circuit which is employed to selectively energize particular switches in an array of switches. The particular switches effect electrical connection of selected resistive nodes among the plurality of resistive nodes associated with each of the first iteration comparators to the first inputs of a second array of comparators. For example, where the analog-to-digital converter is to present an n-bit representation of the received analog signal, and the first iteration comparators are connected to a primary resistive node at every nth resistive node, $n-1$ resistive nodes exist intermediate each secondary resistive node to which the first inputs of the first iteration comparators are connected. Thus, $n-1$ secondary comparators are required to further refine the digital representation of the received analog signal. The most significant resistive node within each of the secondary resistive node groups is selectively switched to a first secondary comparator, the second most-significant resistive node within each of the secondary node groups is selectively switched to a second secondary comparator, and the third most-significant resistive node within each of the secondary node groups is selectively switched to a third secondary comparator. The various outputs of the respective secondary comparators are provided to a logic circuit which interprets the secondary comparator outputs appropriately to represent the less-significant digits of the digital representation of the received analog signal. The logic circuit then proceeds to combine the representations presented by the first iteration comparators with the representations provided by the second iteration comparators (i.e., the most-significant digits and the less-significant digits of the digital, binary, representation) to present as an output the n-bit representation of the received analog signal.

Thus, the two-stage flash converter for an n-bit digital representation of a received analog signal requires n first iteration comparators and $n-1$ second iteration comparators. By way of example, an 8-bit analog-to-digital converter would require 256 comparators if implemented in a flash construction, but would require only 15 comparators if implemented in a two-stage flash configuration.

There are, however, problems with a two-stage flash converter circuit configuration. The switching of the secondary comparators in electrical connection with the resistor tree imposes noise by the sudden introduction of an RC component comprising the resistance at the node to which the secondary comparator is switched, and the inherent capacitance in the switch employed to effect such an electrical connection. Such an RC component, suddenly imposed, generates noise which is manifested as a disturbance of the reference signals presented at each of the secondary comparators and imposes a time delay by the time required for the reference signal to settle after the disturbance is injected by the switching operation. Moreover, the RC factor varies depending upon where the secondary comparator was connected in the resistor tree, since the resistance at different nodes of the resistor tree varies along its length.

There is a need for a half flash analog-to-digital converter which will realize the space-saving benefits of employing fewer comparators, but will not suffer from the inherent speed limitations heretofore experienced by half flash analog-to-digital converters.

SUMMARY OF THE INVENTION

The invention is an apparatus for generating a digital signal output representative of a received analog signal. The apparatus is preferably in a two-stage flash analog-to-digital converter comprising a reference array for establishing an array of reference values at a plurality of reference nodes in response to a reference signal, the plurality of reference nodes being hierarchically arranged from a highest-value reference node to a lowest-value reference node. The apparatus further includes a first comparing circuit for first iteration comparing selected first reference values of the array of reference values with the received analog signal, the first comparing circuit being operatively connected with the plurality of reference nodes appropriately to effect such first iteration comparing.

The first reference values are present at selected first iteration reference nodes among the plurality of reference nodes, which selected first iteration reference nodes establish a plurality of ranges of reference values. The first comparing circuit generates a first iteration output signal indicating a particular range among the plurality of ranges in which the received analog signal first compares with respect to a respective reference value in a predetermined relation.

Further included is a logic circuit for generating output signals in response to received signals according to a predetermined relationship. The logic circuit is operatively connected with the first comparing circuit and generates a control signal in response to the first iteration output signal.

The invention also includes a second comparing circuit for second iteration comparing selected second reference values of the array of reference values with the received analog signal. The second comparing circuit is operatively connected with the plurality of reference nodes appropriately to effect such second iteration comparing. The second reference values are present at selected second iteration reference nodes which are situated in intervals adjacent the first iteration reference nodes, and which hierarchically segment those intervals. The second comparing circuit responds to the control signal received from the logic circuit to effect the second iteration comparing. The second comparing circuit comprises a plurality of second comparator circuits for comparing a first input value with a second input value and generating an output representative of such comparing. Each respective second comparator circuit of the plurality of second comparator circuits receives the input analog signal as a first input value and receives substantially hierarchically equal of the second reference values from selected of the intervals as a plurality of available second input values. Preferably, one of the plurality of available second input values is switchably selected as the second input value to each respective second comparator means in response to the control signal. The second comparing circuit generates a second iteration output signal which represents the second iteration comparing. The logic means operatively responds to the first iteration output signal and the second iteration output signal to generate the digital signal output which represents the received analog signal.

It is, therefore, an object of the present invention to provide an apparatus for generating a digital signal output representative of a received analog signal which is efficient in its occupancy of space on board a substrate when implemented in CMOS technology.

It is a further object of the present invention to provide an apparatus for generating a digital signal output representative of a received analog signal which is faster in operation than prior art two-stage flash analog-to-digital conversion circuits.

Further objects and features of the present invention will be apparent from the following specification and claims when considered in connection with the accompanying drawings illustrating the preferred embodiment of the invention.

DETAILED DESCRIPTION OF THE INVENTION

Figure 1:
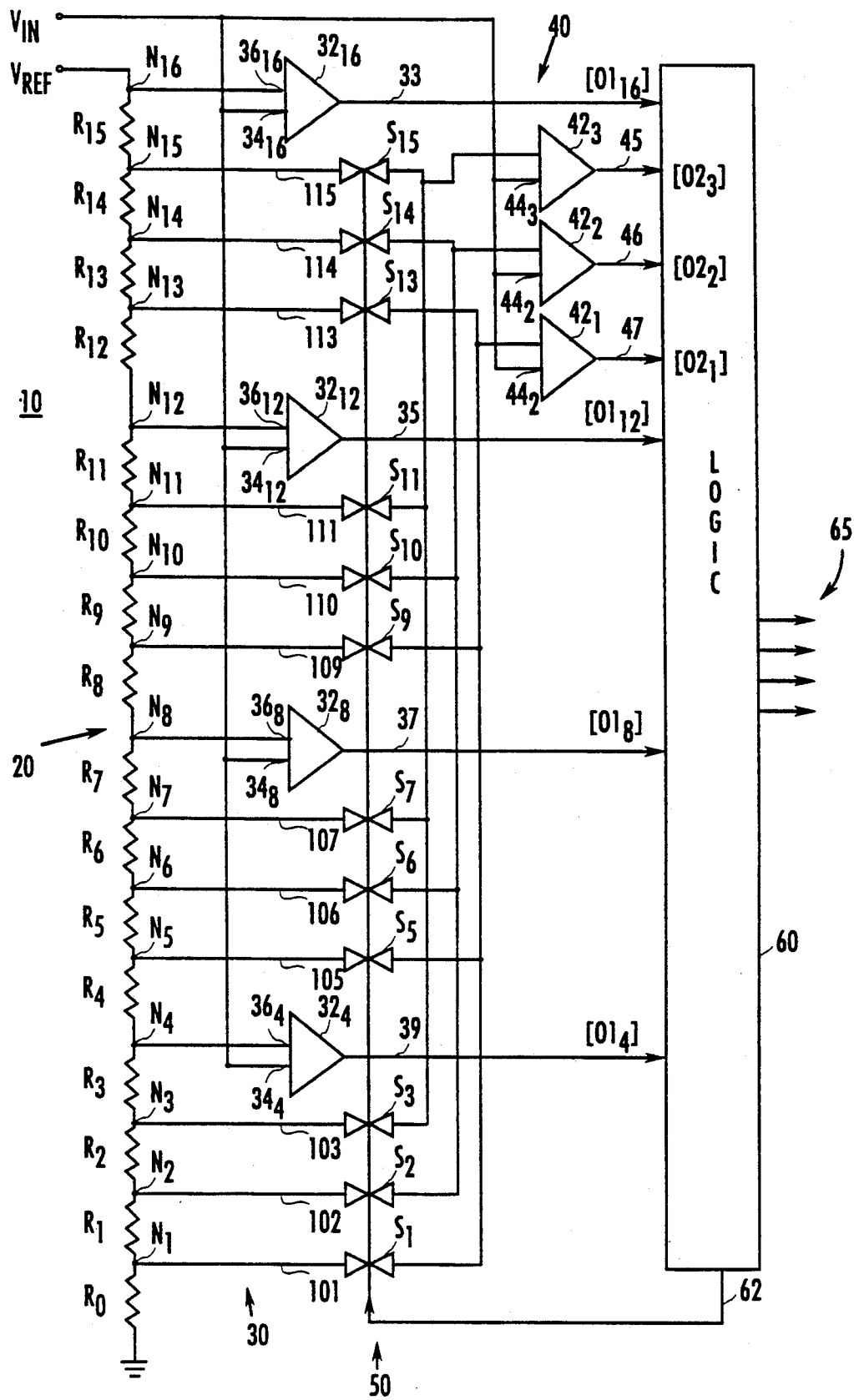
FIG. 1 is an electrical schematic diagram of a prior art embodiment of a two-stage analog-to-digital flash converter.

FIG. 1 is an electrical schematic diagram of a prior art embodiment of a two-stage analog-to-digital flash converter. In FIG. 1, a two-stage flash analog-to-digital converter apparatus 10 is illustrated comprising a reference array 20, a first iteration comparing section 30, a second iteration comparing section 40, a switching section 50, and a logic section 60.

The apparatus illustrated in FIG. 1 is a four-bit two-stage analog-to-digital converter. This size apparatus is employed for illustrative purposes and to facilitate understanding the construction and operation of the apparatus. The principles illustrated and explained in connection with FIG. 1 are directly applicable to higher precision (i.e., larger number of bits) converters as well.

Apparatus 10 receives a voltage reference signal $V_{REF}$ at a reference input 12, and receives an input analog signal $V_{IN}$ at a sample input 14. Reference array 20 is comprised of a resistor tree, or resistor ladder, which employs a plurality of preferably equal-valued resistors $R_i$, where i indicates the significance of the location of a respective resistor $R_i$ within the resistor ladder comprising reference array 20.

First iteration comparing section 30 is comprised of four first iteration comparators $32_i$: $32_4$, $32_8$, $32_{12}$, and $32_{16}$. A first input $34_i$ to a respective first iteration comparator $32_i$ is operatively connected with sample input 14 so that the respective first input $34_i$ conveys input analog signal $V_{IN}$ to a respective first iteration comparator $32_i$. Respective second inputs $36_i$ are connected with reference array 20 at respective reference nodes $N_i$, thereby providing to each first iteration comparator $32_i$ a respective reference signal which is present at the respective node $N_i$. For example, reference node $N_{16}$ will provide reference signal $V_{REF}$ to first iteration comparator $32_{16}$ at its second input $36_{16}$. Reference node $N_{12}$ will provide a lesser reference voltage $V_{REF-12}$ to first iteration comparator $32_{12}$ at its second input $36_{12}$. Lesser reference voltage $V_{REF-12}$ comprises reference signal $V_{REF}$, less the voltage drop occasioned by reference resistors $R_{12}$, $R_{13}$, $R_{14}$, and $R_{15}$. For example, if $V_{REF}$ is 2.0 volts, and the voltage drop occasioned by each of the respective resistors $R_i$ is 0.1 volt, then lesser reference voltage $V_{REF-12}$ would equal 1.6 volts. Similarly, reference node $N_8$ will provide a lesser reference voltage $V_{REF-8}$ to first iteration comparator $32_8$ at its second input $36_8$ (continuing with the above numerical example, lesser reference voltage $V_{REF-8}$ would equal 1.2 volts). Reference node $N_4$ provides a lesser reference signal $V_{REF-4}$ to first iteration comparator $32_4$ at its second input $36_4$ (further continuing with our numerical example, lesser reference voltage $V_{REF-4}$ would equal 0.8 volts).

Thus, first iteration comparing section 30 provides a first iteration output $O1_i$: $O1_{16}$ via line 33, $O1_{12}$ via line 35, $O1_8$ via line 37, and $O1_4$ via line 39.

Preferably, the digital representations of first iteration outputs $O1_i$ are as follows:

TABLE I

| NODE ($N_i$) | $O1_i$ | $O1_i$ VALUE (DECIMAL FORM) | $O1_i$ VALUE (DIGITAL FORM) |
|---|---|---|---|
| $N_4$ | $O1_4$ | 4 | 0100 |
| $N_8$ | $O1_8$ | 8 | 1000 |
| $N_{12}$ | $O1_{12}$ | 12 | 1100 |
| $N_{16}$ | $O1_{16}$ | 16 | 10000 |

Logic section 60 receives first iteration outputs $O1_i$ via lines 33, 35, 37, 39, and, according to a predetermined relationship, generates a control signal via control line 62 to switching section 50.

Switching section 50 is comprised of switches $S_i$: $S_1$, $S_2$, $S_3$, $S_5$, $S_6$, $S_7$, $S_9$, $S_{10}$, $S_{11}$, $S_{13}$, $S_{14}$, and $S_{15}$. Switches $S_i$ respond to the control signal conveyed from logic section 60 via control line 62 to selectively connect reference nodes $N_i$ with second iteration comparing section 40. Reference nodes $N_i$ are connected with switches $S_i$ by lines as follows:

TABLE II

| NODE | SWITCH | LINE |
|---|---|---|
| $N_1$ | $S_1$ | 101 |
| $N_2$ | $S_2$ | 102 |
| $N_3$ | $S_3$ | 103 |
| $N_5$ | $S_5$ | 105 |
| $N_6$ | $S_6$ | 106 |
| $N_7$ | $S_7$ | 107 |
| $N_9$ | $S_9$ | 109 |
| $N_{10}$ | $S_{10}$ | 110 |
| $N_{11}$ | $S_{11}$ | 111 |
| $N_{13}$ | $S_{13}$ | 113 |
| $N_{14}$ | $S_{14}$ | 114 |
| $N_{15}$ | $S_{15}$ | 115 |

Second iteration comparing section 40 is comprised (in this representative embodiment for a 4-bit converter) of second iteration comparators $42_s$: $42_1$, $42_2$, and $42_3$. Each second iteration comparator $42_s$ has its respective first input $44_s$ operatively connected with sample input 14 so that received analog signal $V_{IN}$ is applied to each first input $44_s$.

Reference nodes $N_i$ are arranged in heirarchical order in a manner whereby first iteration comparators $32_i$ are connected to reference array 20 in a manner establishing an interval of reference nodes adjacent each of the connection points for first iteration comparator $32_i$. That is, each first iteration comparator $32_i$ is connected to reference array 20 every nth reference node $N_4$, $N_8$, $N_{12}$, $N_{16}$ (n=4, for this 4-bit converter example). Reference nodes $N_i$ adjacent the most significant bit reference nodes ($N_4$, $N_8$, $N_{12}$, $N_{16}$) are hierarchically arranged within the intervals intermediate most significant bit reference nodes $N_4$, $N_8$, $N_{12}$, $N_{16}$.

For example, if $V_{REF}$ equals 2.0 volts and if the voltage drop across each resistor $R_i$ is 0.1 volt, the following relationships among the various reference nodes $N_i$ exist:

TABLE III

| Node | Most Significant Bit Node | Significance Within Interval | Digital Value | Voltage Level |
|---|---|---|---|---|
| $N_1$ | No | 3 | 0001 | 0.5 |
| $N_2$ | No | 2 | 0010 | 0.6 |
| $N_3$ | No | 1 | 0011 | 0.7 |
| $N_4$ | Yes | — | 0100 | 0.8 |
| $N_5$ | No | 3 | 0101 | 0.9 |
| $N_6$ | No | 2 | 0110 | 1.0 |
| $N_7$ | No | 1 | 0111 | 1.1 |
| $N_8$ | Yes | — | 1000 | 1.2 |
| $N_9$ | No | 3 | 1001 | 1.3 |
| $N_{10}$ | No | 2 | 1010 | 1.4 |
| $N_{11}$ | No | 1 | 1011 | 1.5 |
| $N_{12}$ | Yes | — | 1100 | 1.6 |
| $N_{13}$ | No | 3 | 1101 | 1.7 |
| $N_{14}$ | No | 2 | 1110 | 1.8 |
| $N_{15}$ | No | 1 | 1111 | 1.9 |
| $N_{16}$ | Yes | — | 10000 | 2.0 |

In operation, the control signal conveyed via control line 62 will actuate selected switches $S_i$ in response to first iteration outputs $O1_i$ to connect the selected switches $S_i$ with the reference nodes $N_i$ within the interval associated with the highest of the most significant bit nodes $N_4$, $N_8$, $N_{12}$, $N_{16}$ for which received analog signal $V_{IN}$ exceeds reference voltage $V_{REF}$. This determination is, of course, made by first iteration comparators $32_i$ and is indicated by first iteration output signal $O1_i$.

For example, if received analog signal $V_{IN}$ is sampled at a level of 1.05 volts, comparator $32_{16}$, comparator $32_{12}$, and comparator $32_8$ will all have a first iteration output $O1_i = 0$; and first iteration comparator $32_4$ will generate a first iteration output $O1_4 = 1$. Accordingly, logic section 60 will generate a control signal via control line 62 which will operatively connect nodes $N_1$, $N_2$, $N_3$ via lines 101, 102, 103 and switches $S_1$, $S_2$, $S_3$, respectively, with second iteration comparing section 40. The remaining switches $S_i$ will remain open. In such fashion, first iteration comparing section 30 establishes the most significant bit of the digital representation of received analog signal $V_{IN}$; second iteration comparing section 40 refines the representation of received analog signal $V_{IN}$ within the range established by first iteration comparing section 30. That is, second iteration comparing section 40 ascertains at what level within the range of reference nodes $N_i$ adjacent most-significant bit node $N_4$ (i.e., reference nodes $N_1$, $N_2$, $N_3$) accurately represents received analog signal $V_{IN}$. In the foregoing example (i.e., where $V_{IN} = 1.05$ volts), it may be observed that 1.05 volts falls intermediate nodes $N_6$, $N_7$ so that node $N_6$ will cause second iteration comparator $42_2$ to indicate a second iteration output $O2_2$ equal to 1, node $N_5$ will cause second iteration comparator $42_1$ to indicate a second iteration output $O2_2$ equal to 1, and node $N_7$ will cause second iteration comparator $42_3$ to indicate a second iteration output $O2_3$ equal to 0. Thus, logic section 60 receives an indication from second iteration outputs $O2_s$ that the highest significance second iteration output associated with $V_{IN}$ (at a value of 1.05 volts) occurs at line 46.

Second iteration outputs $O2_s$ are preferably assigned a digital value indicating their relative significance within their particular range being addressed, as specified by switches $S_i$, as follows:

TABLE IV

| $O2_s$ | Digital Value |
|---|---|
| $O2_1$ | 0001 |
| $O2_2$ | 0010 |

TABLE IV-continued

| $O2_s$ | Digital Value |
|---|---|
| $O2_3$ | 0011 |

Logic section 60 combines the results indicated by first iteration outputs $O1_i$ with the results indicated by second iteration outputs $O2_s$ to generate at its output 65 a 4-digit binary representation of received analog signal $V_{IN}$. In the example above, where $V_{IN}=1.05$ volts, the digital output would be a combination of the indication provided by first iteration output $O1_i$:0100 (most-significant bits); and the indications provided by second iteration outputs $O2_s$:0010 (least-significant digits), to yield a digital representation of $V_{IN}$ (1.05 volts) of 0110.

There are problems with the prior art circuit illustrated in FIG. 1. Principal among those problems is the capacitance which is injected into the affected circuitry upon actuation (i.e., closing) of appropriate switches $S_i$ in response to the control signal received via control line 62. That inherent capacitance, and the resistive value of the particular node $N_i$ affected by closing a respective switch $S_i$, introduce an RC (resistance-capacitance) factor which destabilizes the reference signal which is received from the respective reference node $N_i$, and presented to a respective second iteration comparator $42_s$. A period of time is required for the reference signal to settle from the destabilizing influence of the RC factor introduced by the closing of a particular switch $S_i$ so that some recovery time must lapse before second iteration comparing section 40 can reliably perform. This problem is further compounded by the fact that the R contribution to the RC factor varies as one chooses different nodes $N_i$ in reference array 20.

The problem of sudden injection of high capacitance and its resultant disruptive introduction of an RC factor to a reference signal is minimized by the present invention.

Figure 2:
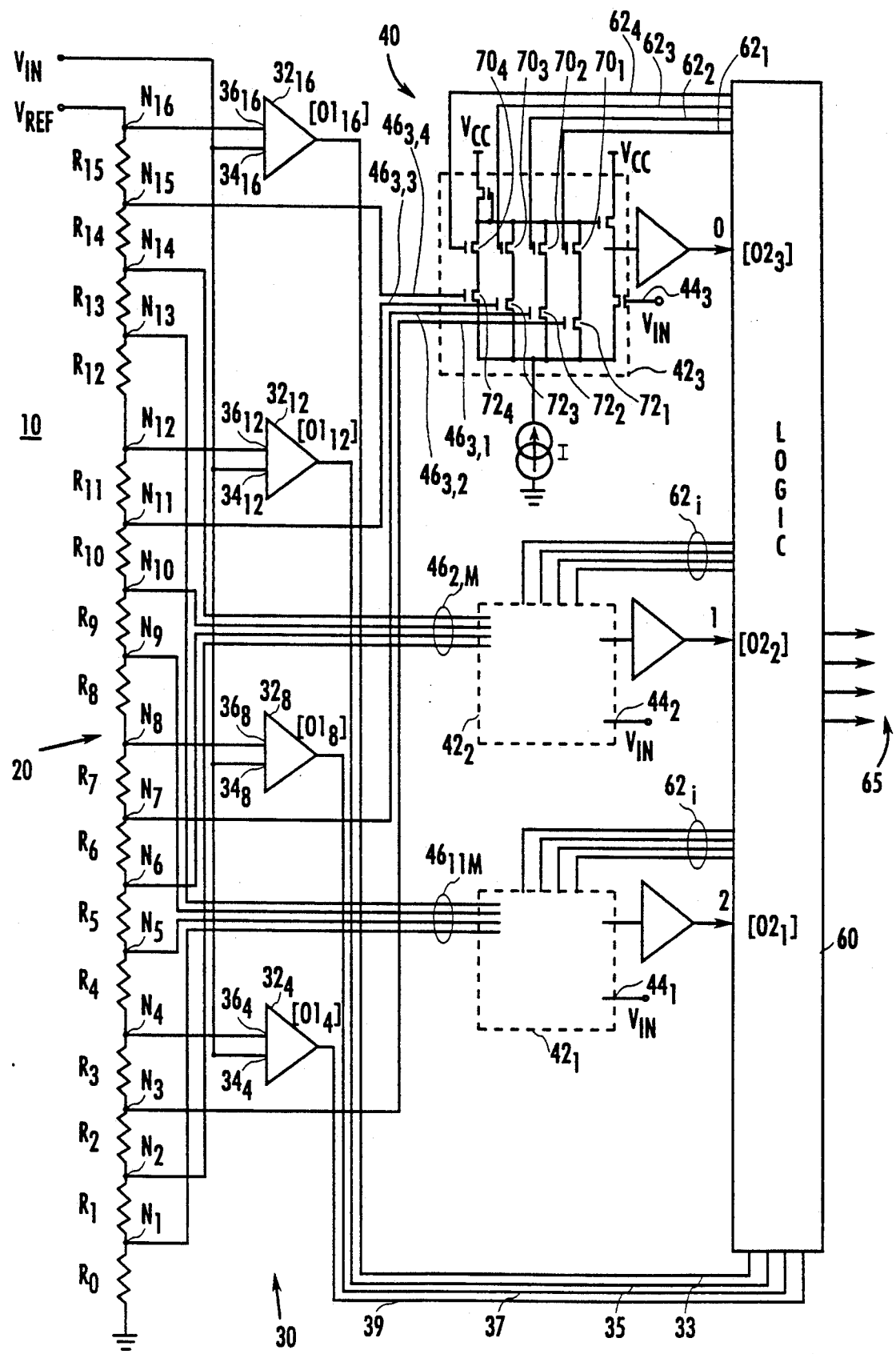
FIG. 2 is an electrical schematic diagram of the preferred embodiment of the present invention.

FIG. 2 is an electrical schematic diagram of the preferred embodiment of the present invention. In order to facilitate understanding of the present invention, like elements will be identified by like reference numerals in the various drawings.

FIG. 2 is a preferred representative embodiment of the invention. FIG. 2 illustrates a 4-bit, two-stage analog-to-digital converter apparatus 10 including a reference array 20, a first iteration comparing section 30, a second iteration comparing section 40, and a logic section 60.

As with the prior art apparatus illustrated in FIG. 1, resistive array 20 is preferably comprised of a plurality of resistors $R_i$, hierarchically arranged, establishing an equal voltage drop across each of the resistors $R_i$. Reference nodes $N_i$ are established intermediate resistors $R_i$ and have the same relationships as illustrated earlier in connection with Tables I and III. Input analog signal $V_{IN}$ is received at a sample input 14 and is applied to first inputs $34_i$ of first iteration comparators $32_i$. Reference signal $V_{REF}$ is received at a reference input 12 and is applied to reference array 20. First iteration comparator $32_4$ receives a reference signal at its second input $36_4$ from most-significant bit reference node $N_4$; first iteration comparator $32_8$ receives at its second input $36_8$ a reference signal from most-significant bit reference node $N_8$; first iteration comparator $32_{12}$ receives at its second input $36_{12}$ a reference signal from most-significant bit reference node $N_{12}$; and first iteration comparator $32_{16}$ receives at its second input $36_{16}$ a reference signal equal to $V_{REF}$ from most-significant bit reference node $N_{16}$. Reference nodes $N_i$ are arranged in hierarchical order with most-significant bit reference nodes $N_4$, $N_8$, and $N_{12}$, and $N_{16}$ each having adjacent intervals of reference nodes $N_i$.

Second iteration comparing section 40 is comprised of second iteration comparators $42_s$. For simplicity of presentation, and to facilitate understanding the present invention, only second iteration comparator $42_3$ is illustrated in detail.

First iteration comparators $32_i$ generate first iteration outputs $O1_i$. First iteration output $O1_4$ is conveyed to logic section 60 via a line 39, first iteration output $O1_8$ is conveyed to logic section 60 via a line 37, first iteration output $O1_{12}$ is conveyed to logic section 60 via a line 35, and first iteration output $O1_{16}$ is conveyed to logic section 60 via a line 33.

Logic section 60 responds to first iteration output signals $O1_i$ to convey control signals via control lines $62_a$: $62_1$, $62_2$, $62_3$, $62_4$. Second iteration comparators $42_s$ receive input analog signal $V_{IN}$ via respective first inputs $44_s$. Second iteration comparators $42_s$ are constructed to receive a plurality of available second inputs $46_{s,m}$. Thus, for example, second iteration comparator $42_3$ has an available second input $46_{3,1}$, $46_{3,2}$, $46_{3,3}$, and $46_{3,4}$.

The interconnections between reference array 20 and second iteration comparator section 40 are different than previously described in connection with the prior art apparatus of FIG. 1 since each input to a respective second iteration comparator $42_s$ is applied to an independent, switchably selectable, connection with the particular second iteration comparator $42_s$. Specifically, each of the available second inputs $46_{3,m}$ is independently provided from a similarly significant reference node $N_i$ within each of the respective reference intervals associated with the most significant bit reference nodes $N_4$, $N_8$, $N_{12}$, and $N_{16}$. That is, for example, available second input $46_{3,1}$ is provided from reference node $N_3$, the most-significant reference node $N_i$ associated with most-significant bit reference node $N_4$; available second input $46_{3,2}$ is provided from reference node $N_7$, the most significant reference node $N_i$ associated with most-significant bit reference node $N_8$; available second input $46_{3,3}$ is provided from reference node $N_{11}$, the most significant reference node $N_i$ associated with most-significant bit reference node $N_{12}$; and available second input $46_{3,4}$ is provided from reference node $N_{15}$, the most significant reference node $N_i$ associated with most-significant bit reference node $N_{16}$. Similarly, available second inputs $46_{2,m}$ are provided from reference nodes $N_2$, $N_6$, $N_{10}$, and $N_{14}$, the second most-significant nodes associated with the respective most-significant bit reference nodes $N_4$, $N_8$, $N_{12}$, and $N_{16}$; and available second inputs $46_{1,m}$ are provided respectively from reference nodes $N_1$, $N_5$, $N_9$, and $N_{13}$, the third most-significant reference nodes $N_i$ associated respectively with most-significant bit reference nodes $N_4$, $N_8$, $N_{12}$, and $N_{16}$.

Logic section 60 responds to receiving first iteration outputs $O1_i$ by generating control signals on control lines $62_a$ appropriately to select one of the available second inputs $46_{s,m}$ as the applied second input for the respective second iteration comparators $42_s$ in response to the most-significant digit associated with input analog signal $V_{IN}$, as indicated by first iteration outputs $O1_i$.

Thus, by way of example, if $V_{IN}=1.05$ volts, $V_{REF}=2.0$ volts, and each resistor $R_i$ in reference array 20 establishes a 0.1 volt voltage drop, then the values associated with Table III apply to the various nodes $N_i$ so that first iteration output $O1_4$ will equal 1, and first iteration outputs $O1_8$, $O1_{12}$, and $O1_{16}$ will each equal 0. Thus, in this example, the value associated with first iteration outputs $O1_i$ will be 4 (digital value 0100). Accordingly, logic circuit 60 would assign the following values to control lines $62_a$:

TABLE V

| $62_a$ | Digital Value |
|---|---|
| $62_1$ | 1 |
| $62_2$ | 0 |
| $62_3$ | 1 |
| $62_4$ | 1 |

Each control line $62_a$ is connected to operate a gate on a switching field effect transistor (FET) $70_m$. Thus, control line $62_1$ controls the gate for switching FET $70_1$, control line $62_2$ controls the gate for switching FET $70_2$, control line $62_3$ controls the gate for switching FET $70_3$, and control line $62_4$ controls the gate for switching FET $70_4$. Preferably switching FET's $70_m$ are p-channel FET's so that a 0 signal actuates the gate and closes the respective switching FET $70_m$. Accordingly, in the example given above with $V_{IN}$ equal to 1.05 volts, and $V_{REF}$ equal to 2.0 volts, the presence of a zero signal on control line $60_2$ closes switching FET $70_2$, thereby including a second input comparing FET $72_2$ to participate in comparisons conducted by second iteration comparator $42_3$. Accordingly, second input comparing FET's $72_1$, $72_3$, and $72_4$ are isolated by their respective switching FET's $70_1$, $70_3$, $70_4$ so that only one of the available second inputs $46_{s,m}$ may participate in comparator operations.

In the example given, available second input $46_{3,2}$ is applied as the second input to comparator $42_3$ and participates in the comparison operations conducted by second iteration comparator $42_3$. Similarly, control lines $62_a$ applied to second iteration comparator $42_2$ and second iteration comparator $42_1$, effect actuation of switching FET $70_2$ in each of the respective second iteration comparators $42_2$, $42_1$ so that the applied input to second iteration comparator $42_2$ is available second input $46_{2,2}$, and the applied input to second iteration comparator $42_1$ is available second input $46_{1,2}$. Thus, in the example given, second iteration comparator $42_1$ is comparing $V_{IN}$ (1.05 volts) with the reference signal present at reference node $N_5$; second iteration comparator $42_2$ is comparing $V_{IN}$ with the reference signal available at reference node $N_6$; and second iteration comparator $42_3$ is comparing $V_{IN}$ with the reference signal present at reference node $N_7$. Accordingly, second iteration output $O2_1$ has a value of 1, second iteration output $O2_2$ has a value of 1, and second iteration value $O2_3$ has a value of 0. Thus, second iteration outputs $O2_s$ indicate an output of 2 (0010) and logic section 60 combines the indications of first iteration output $O1_i$ with second iteration output $O2_s$ to generate at outputs 65 a digital representation of $V_{IN}$ having a digital value of 0110.

The provision of a plurality of available second inputs $46_{s,m}$ to each respective second iteration comparator $42_s$, and the provision for selectably switching the available second inputs in response to a control signal on control lines $62_a$ to respective second iteration comparators $42_s$ by p-channel FET's (n-channel FET's could also be used, with a different signalling scheme) yields a lower noise injection into the reference signals received at the available second inputs of second iteration comparators $42_s$ than with prior art devices. Switching FET's $70_m$ are precharged and therefore inject very little capacitance to the interconnection between reference array 20 and second iteration comparing section 40. As a consequence, little or no settling time is required in order to effect a reliable comparison between a selected reference value and the input analog signal $V_{IN}$, resulting in increased speed of operation of the preferred embodiment of the present invention illustrated in FIG. 2 over the operational speed of the prior art apparatus illustrated in FIG. 1.

It is to be understood that, while the detailed drawing and specific examples given describe preferred embodiments of the invention, they are for the purpose of illustration, that the apparatus of the invention is not limited to the precise details and conditions disclosed and that various changes may be made therein without departing from the spirit of the invention which is defined by the following claims:

I claim:

1. An apparatus for generating a digital signal output representative of a received analog signal, the apparatus comprising:

a reference means for establishing an array of reference values at a plurality of reference nodes in response to a reference signal; said plurality of reference nodes being hierarchically arranged from a highest-value reference node to a lowest-value reference node;

a first comparing means for first iteration comparing selected first reference values of said array of reference values with said received analog signal, said first comparing means being operatively connected with said plurality of reference nodes appropriately to effect said first iteration comparing, said first reference values being present at selected first iteration reference nodes among said plurality of reference nodes, said selected first iteration reference nodes establishing a plurality of ranges of said reference values; said first comparing means generating a first iteration output signal indicating a particular range among said plurality of ranges in which said received analog signal first compares with respect to said threshold value in a predetermined relation;

a logic means for generating output signals in response to received signals according to a predetermined relationship; said logic means being operatively connected with said first comparing means and generating a control signal in response to said first iteration output signal; and a second comparing means for second iteration comparing selected second reference values of said array of reference values with said received analog signal; said second comparing means being operatively connected with said plurality of reference nodes appropriately to effect said second iteration comparing, said second reference values being present at selected second iteration reference nodes, said second iteration reference nodes being situated in intervals adjacent said first iteration reference nodes and hierarchically segmenting said intervals; said second comparing means responding to said control signal to effect said second iteration comparing;

said second comparing means comprising a plurality of comparator means for comparing a first input value with a second input value and generating an output representative of said comparing; each respective comparator means of said plurality of comparator means receiving said received analog signal as said first input value and each comparator means comprising first and second transistors, said first transistors being coupled to said second transistors and said logic means, said control signal being applied to aid first transistors, and the gates of said second transistors being each connected to a respective selected second iteration reference node, where said second reference values as said second input values, and said comparator means compares said first and second input values in response to said control signal; said second comparing means generating a second iteration output signal representing said second iteration comparing;

said logic means operatively responding to said first iteration output signal and said second iteration output signal to generate said digital signal output.

2. An apparatus for generating a digital signal output representative of a received analog signal as recited in claim 1 wherein said reference means comprises a resistive array and said array of reference values comprises an array of voltage values established by said reference signal being applied to said resistive array.

3. An apparatus for generating a digital signal output representative of a received analog signal as recited in claim 1 wherein said first comparing means comprises an array of first comparators operatively connected with said selected first iteration reference nodes and operatively receiving said received analog signal.

4. An apparatus for generating a digital signal output representative of a received analog signal as recited in claim 1 wherein said gates of said first transistors are connected to said logic means.

5. An apparatus for generating a digital signal output representative of a received analog signal as recited in claim 2 wherein said first comparing means comprises an array of first comparators operatively connected with said selected first iteration reference nodes and operatively receiving said received analog signal.

6. An apparatus for generating a digital signal in response to an analog signal, said analog signal having a magnitude, said digital signal being representative of said magnitude; the apparatus comprising:

a reference means for establishing a reference array; said reference means being operatively arranged to receive a reference signal, said reference array including a plurality of first reference values representative of said reference signal, said plurality of first reference values being hierarchically arranged;

a first comparing means for first iteration comparing said plurality of first reference values with said analog signal; said first comparing means generating a first iteration output signal representing an order estimate of said magnitude, each of said plurality of first reference values having an associated adjacent plurality of second reference values, each said associated plurality of second reference values being hierarchically arranged spanning an associated hierarchical interval;

a logic means for generating output signals in response to received signals; said logic means receiving said first iteration output signal and generating a control signal in response to said first iteration output signal; and a second comparing means for second iteration comparing said associated plurality of second reference values with said analog signal; each said associated plurality of second reference values establishing a range of intermediate representations of said reference signal within said associated hierarchical interval, said second comparing means including a pluralityof comparator means for comparing a selected first input signal with a second input signal, each of said plurality of comparator means receiving said analog signal as said first input signal; each comparator means comprising first and second transistors, said first transistors being coupled to said second transistors and said logic means, said control signal being applied to said first transistors, and said second reference values being applied to respective gates of said second transistors, where said second reference values as said second input values, and said comparator means compares said first and second input values in response to said control signal; said second comparing means generating a second iteration output signal representing said second iteration comparing, said second iteration output signal representing a hierarchical resolving value of said analog signal within said interval associated with a particular first reference value of said plurality of first reference values;

said logic means receiving said second iteration output signal and operatively responding to said first iteration output signal and said second iteration output signal according to a second predetermined relationship to generate said digital signal.

7. An apparatus for generating a digital signal in response to an analog signal as recited in claim 6 wherein said reference means comprises a resistive array and said reference array comprises an array of voltage values established by said reference signal being applied to said resistive array.

8. An apparatus for generating a digital signal in response to an analog signal as recited in claim 6 wherein said first comparing means comprises an array of first comparators operatively connected with said reference array and operatively receiving said analog signal.

9. An apparatus for generating a digital signal in response to an analog signal as recited in claim 6 wherein said gates of said first transistors are connected to said logic means.

10. An apparatus for generating a digital signal in response to an analog signal as recited in claim 7 wherein said first comparing means comprises an array of first comparators operatively connected with said reference array and operatively receiving said analog signal.

11. A circuit for converting an analog signal to a digital signal comprising:

an analog signal input;

first and second reference terminals;

a voltage reference circuit including a series of nodes coupled between the reference terminals, where the circuit is configured to produce reference voltages at each node, with the reference voltages at the nodes increasing from the first node to the last node in the series;

at least one comparator coupled to the signal input and an intermediate node in the series, where a first set of at least two of the nodes lay between the intermediate node and the first reference terminal and a second set of at least two of the nodes lay between the intermediate node and the second reference terminal;

a logic circuit including a first logic output, a second logic output, a first logic input coupled to the comparator, where the logic circuit is configured to output a first signal at the first logic output when an input signal at the signal input is greater than the voltage at the intermediate node and output a second signal at the second logic output when the input signal is less than the voltage at the intermediate node, the logic circuit further including second and third logic inputs and a digital output; a first comparator circuit coupled to the second logic input and the analog signal input, the first comparator circuit including first and second transistors wherein transistor is connected to another node of the first set, the second transistor is coupled to the first logic output, and the first comparator circuit is configured to output a first comparison signal to the second logic input when the voltage at the one node is above a first predetermined limit; and a second comparator circuit coupled to the third logic input and the analog signal input, the second compartor circuit including third and fourth transistors wherein where the gate of the third transistor is connected to another node of the first set, the fourth transistor is coupled to the second logic output, and the second comparator circuit is configured to output a second comparison signal to the third logic input when the voltage at the another node is above a second predetermined limit;

the logic circuit being configured to output a digital signal at the digital output representative of a voltage at the analog input based upon the status of the logic inputs.

12. The circuit of claim 11, where the voltage reference circuit further includes a plurality of resistors coupled in series at the nodes.

13. The circuit of claim 12, where the gate of the second transistor is connected to the second logic output, and the gate of the fourth transistor is connected to the third logic output.

14. The circuit of claim 13, where the second and fourth transistors are precharged.

* * * * *